(12) United States Patent
Ma et al.

(10) Patent No.: US 12,277,901 B2
(45) Date of Patent: Apr. 15, 2025

(54) DISPLAY PANEL AND DISPLAY DEVICE WITH IRREGULAR REGION

(71) Applicant: Wuhan Tianma Microelectronics Co., Ltd., Wuhan (CN)

(72) Inventors: Yangzhao Ma, Wuhan (CN); Meihong Wang, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/433,599

(22) Filed: Feb. 6, 2024

(65) Prior Publication Data
US 2024/0177656 A1 May 30, 2024

(30) Foreign Application Priority Data
Jul. 28, 2023 (CN) .......................... 202310956149.6

(51) Int. Cl.
*G09G 3/32* (2016.01)
*G09G 3/3208* (2016.01)

(52) U.S. Cl.
CPC .................................. *G09G 3/3208* (2013.01)

(58) Field of Classification Search
CPC ...................................................... G09G 3/3208
See application file for complete search history.

(56) References Cited

U.S. PATENT DOCUMENTS

| | | | |
|---|---|---|---|
| 2019/0005915 A1* | 1/2019 | Liu | G02F 1/136286 |
| 2023/0347741 A1* | 11/2023 | Wu | B60K 35/60 |
| 2024/0122005 A1* | 4/2024 | Choi | G09G 3/3233 |

* cited by examiner

*Primary Examiner* — Roy P Rabindranath
(74) *Attorney, Agent, or Firm* — KDW Firm PLLC

(57) ABSTRACT

Provided are a display panel and a display device. The display panel includes a first display region, a second display region, a first non-display region, a second non-display region, a third non-display region and multiple pixels. The first display region and the second display region form a display panel with an irregular shape, and the first non-display region, the second non-display region and the third non-display region are located in an irregular region of the display panel. A width of the first non-display region is a, a width of the second non-display region is b, a width of the third non-display region is c, and a preset difference value is m, where $|a-b|\leq m$, $|c-b|\leq m$, and $|a-c|\leq m$.

20 Claims, 8 Drawing Sheets

DISPLAY PANEL AND DISPLAY DEVICE WITH IRREGULAR REGION

CROSS-REFERENCE TO RELATED APPLICATION

This application claims priority to Chinese Patent Application No. 202310956149.6 filed Jul. 28, 2023, the disclosure of which is incorporated herein by reference in its entirety.

TECHNICAL FIELD

The present disclosure relate to the field of display technologies, and in particular to, a display panel and a display device.

BACKGROUND

In order to match a camera region, the display region of some intelligent apparatuses may appear in an irregular shape so as to make room for the camera region, and for a display panel with an irregular region, frames of the irregular region of the display panel may also be different in appearance due to the arrangement of the peripheral control circuit, thereby affecting the visual experience of the user during use.

SUMMARY

In order to solve the above-described technical problems, the present disclosure provides a display panel and a display device.

The present disclosure provides a display panel. The display panel includes a first display region, a second display region, a first non-display region, a second non-display region, a third non-display region, and multiple pixels. A length of the first display region in a first direction is less than a length of the second display region in the first direction, and the first display region is adjacent to the second display region. Along a second direction, the first non-display region is located on a side of the first display region facing away from the second display region. Along the first direction, the second non-display region is located on a side of the first display region and is located between the first non-display region and the third non-display region, the second non-display region is adjacent to the first non-display region, and the second non-display region is adjacent to the third non-display region. In the second direction, the third non-display region is located on a side of the second display region facing the first display region, and the first direction intersects the second direction. A width of the first non-display region is a, a width of the second non-display region is b, a width of the third non-display region is c, and a preset difference value is m, where $|a-b|\le m$, $|c-b|\le m$, and $|a-c|\le m$.

Based on the same inventive concept, the present disclosure further provides a display device including the display panel of any one of the aspects described above.

BRIEF DESCRIPTION OF DRAWINGS

The accompanying drawings here, which are incorporated in and constitute a part of the specification, show embodiments consistent with the present disclosure, and the accompanying drawings together with the specification serve to explain the principles of the present disclosure.

In order to more clearly explain the technical schemes in embodiments of the present disclosure or the related art, the drawings used for describing the embodiments or the related art will be briefly introduced below. Obviously, for those of ordinary skill in the art, other drawings may also be obtained without creative labor according to these drawings.

DETAILED DESCRIPTION

In order to clearly understand the above-described purposes, features and advantages of embodiments of the present disclosure, the schemes of the embodiments of the present disclosure will be further described below. It should be noted that the embodiments of the present disclosure and the features in the embodiments of the present disclosure may be combined with each other without conflict.

Numerous specific details are set forth in the following description in order to provide a thorough understanding of the embodiments of the present disclosure, however, the embodiments of the present disclosure may also be implemented in other manners different from manners described here. Apparently, the embodiments in the specification are merely a part of the embodiments of the present disclosure, rather than all of the embodiments of the present disclosure.

Figure 1:
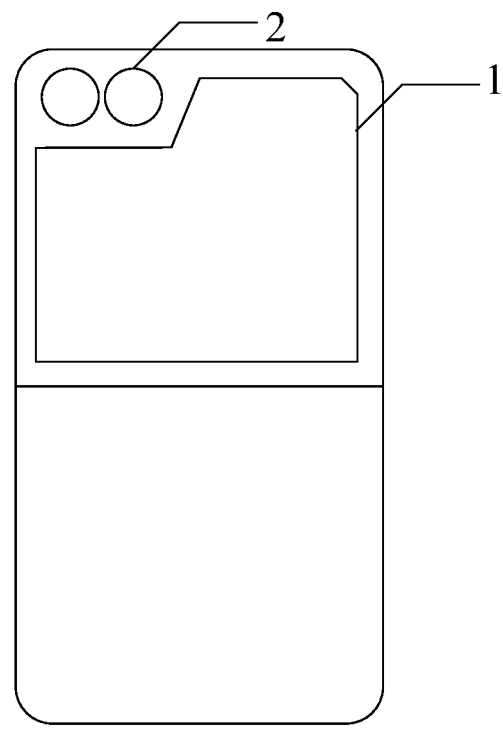
FIG. 1 is a schematic structural diagram of an electronic apparatus according to an embodiment of the present disclosure.

The present application provides a special-shaped panel as shown in FIG. 1. FIG. 1 shows a foldable electronic apparatus, and the foldable electronic apparatus includes a display screen 1 and a camera 2. It can be seen that, in order to fit with the camera 2, the display screen 1 has an irregular special-shaped design and a large angle gap region, and the large angle gap region may be used to place the camera 2. Multiple cameras 2 may be provided, and the multiple cameras 2 may improve the use experience of a user. For a display panel with an irregular region, frames of the irregular region of the display panel are also different in appearance due to the arrangement of the peripheral control circuit, so that widths of frames in different regions of the display panel are different, the obvious visual differences are caused, or obvious dividing lines may exist between the display screen 1 and the cameras 2, thereby affecting the visual experience of the user during use.

Figure 2:
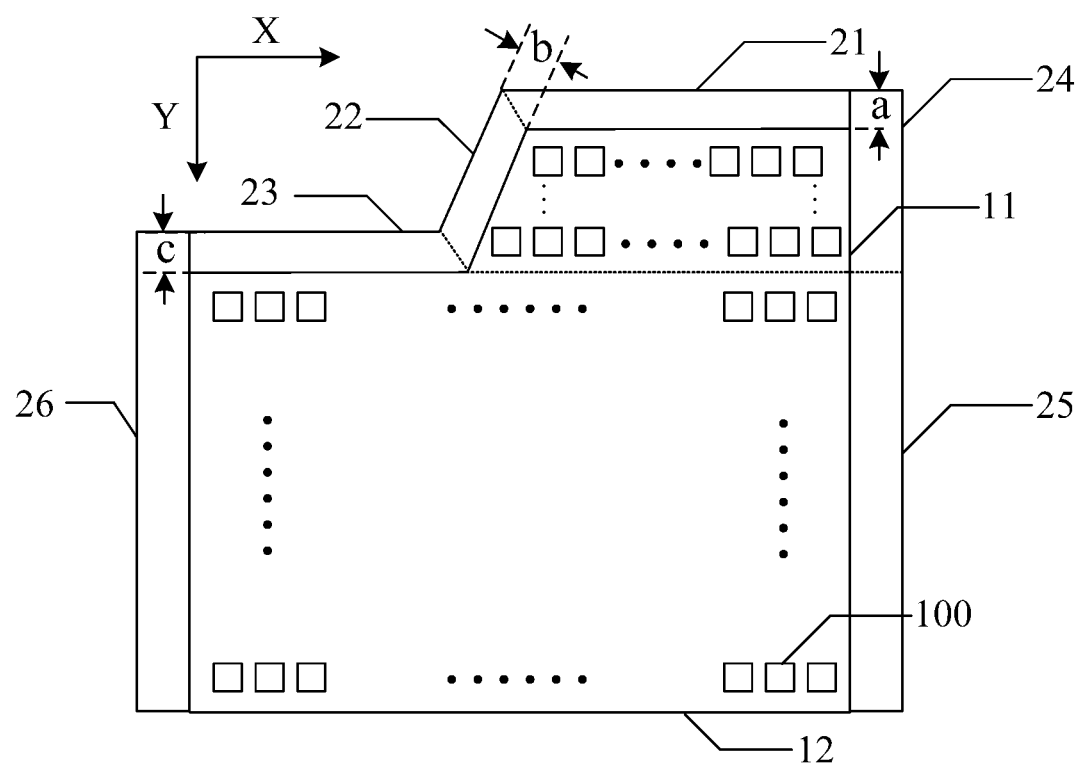
FIG. 2 is a schematic structural diagram of a display panel according to an embodiment of the present disclosure.

In view of the above, an embodiment of the present disclosure provides a display panel, as shown in FIG. 2, the display panel includes a first display region 11, a second display region 12, a first non-display region 21, a second non-display region 22, a third non-display region 23 and multiple pixels 100.

A length of the first display region 11 in a first direction X is less than a length of the second display region 12 in the first direction X, and the first display region 11 is adjacent to the second display region 12.

Specifically, the first direction X described above may be an arrangement direction of a pixel row, pixel rows that the first display region 11 is adjacent to the second display region 12 are flush on one side, and a difference value between a number of pixels arranged in the first direction X of the first display region 11 and a number of pixels arranged in the direction X of the second display region 12 is greater than a first number, and the first number may be 100, 200, 250 to 270, or 260. It should be understood that, in order to have enough space for placing the camera 2, at a position where the first display region 11 is adjacent to the second display region 12, the relatively obvious difference exists between a number of pixels in a last row of pixel rows of the first display region 11 and a number of pixels in a first row of pixel rows of the second display region 12, in other words, in this case, it is equivalent to remove a part of pixel columns arranged along the first direction X in the first display region 11, and a number of removed pixel columns may be 100, 200, or between 250 to 270

As shown in FIG. 2, along a second direction Y, the first non-display region 21 is located on a side of the first display region 11 facing away from the second display region 12. Along the first direction X, the second non-display region 22 is located on a side of the first display region 11 and is located between the first non-display region 21 and the third non-display region 23, the second non-display region 22 is adjacent to the first non-display region 21, and the second non-display region 22 is adjacent to the third non-display region 23. In the second direction Y, the third non-display region 23 is located on a side of the second display region 12 facing the first display region 11, and the first direction X intersects the second direction Y.

Specifically, a side of the second non-display region 22 facing away from the first display region 11 and a side of the third non-display region 23 facing away from the second display region 12 include a non-display panel component for example an optical assembly such as a camera, in other words, the second non-display region 22 is located between the optical assembly (such as, the camera) and the first display region 11. A difference value between a length of the first display region 11 in the first direction X and a length of the second display region 12 in the first direction X is greater than a length of the above-described non-display panel component in the first direction X. Specifically, the first direction X intersects the second direction Y perpendicularly.

Specifically, as shown in FIG. 2, the display panel further includes a fourth non-display region 24, a fifth non-display region 25 and a sixth non-display region 26. Along the first direction X, the fourth non-display region 24 is located on a side of the first display region 11 facing away from the second non-display region 22. The fifth non-display region 25 is located on a side of the second display region 12, and the fifth non-display region 25 is adjacent to the fourth non-display region 24. The sixth non-display region 26 is located on a side of the second display region 12, and the sixth non-display region 26 is adjacent to the third non-display region 23. The same applies to the drawings of the following embodiments, and the details are not repeated. Optionally, a width of the fourth non-display region 24, a width of the fifth non-display region 25, and a width of the sixth non-display region 26 are the same.

As shown in FIG. 2, a width of the first non-display region 21 is a, a width of the second non-display region 22 is b, a width of the third non-display region 23 is c, and a preset difference value is m, where $|a-b| \leq m$, $|c-b| \leq m$, and $|a-c| \leq m$.

Specifically, the first non-display region 21, the second non-display region 22 and the third non-display region 23 each include a cutting edge and an edge which is opposite to the cutting edge and is adjacent to the first display region 11 or the second display region 12. The width of the first non-display region 21, the width of the second non-display region 22, and the width of the third non-display region 23 may be a shortest distance from the cutting edge to another edge. Optionally, since the first display region 11 includes multiple pixels 100, a pixel of the multiple pixels 100 may include a pixel circuit and a light-emitting element, and the multiple pixels 100 are arranged in multiple pixel rows in the second direction Y. As an example, an edge of the first display region 11 adjacent to the second non-display region 22 may be a dummy line formed by connecting edges of the light-emitting elements closest to the second non-display region 22 among the multiple pixel rows. Optionally, as an example, the side of the first display region 11 adjacent to the second non-display region 22 may also be a dummy line formed by connecting edges of the pixel circuits closest to the second non-display region 22. It should be understood that a boundary of the display region adjacent to the non-display region may also be divided by other structures.

In the present application, the difference in widths of the frames of the irregular regions in the display panel (that is, the first non-display region 21, the second non-display region 22, and the third non-display region 23 described above) is reduced, so that the uniformity of the frames at each position of the irregular region is improved, the difference in appearance of a frame of a special-shaped display panel is reduced, and thus the visual experience of the user during use is improved.

Optionally, the preset difference value m described above ranges from 0.08 mm≤m≤0.12 mm, and optionally, m=0.1 mm.

When the preset difference value m is about 0.1 mm, it is difficult to observe the difference in widths of a frame region by the naked eye. Moreover, since a process error occurs in the manufacturing process, it is not necessary to define an excessively small preset difference value m, and the preset difference value is approximately between 0.08 mm to 0.12 mm.

Optionally, as shown in FIG. 2, the width a of the first non-display region 21, the width b of the second non-display region 22, and the width c of the third non-display region 23 are all less than or equal to the preset width W.

The widths of the frames of the irregular region in the display panel are reduced, so that the visual acuity of the frames of the irregular region in the display panel can be reduced, and thus the visual experience of the user during use can be further improved.

Optionally, the preset width W described above ranges from 1.4 mm≤W≤1.6 mm, and optionally, W=1.5 mm.

When the preset width W is about 1.5 mm, the frame of the display panel is not obvious to the naked eye, and moreover, in order to facilitate the arrangement of a peripheral circuit in the non-display region, the preset width W is not limited to be too small.

Figure 3:
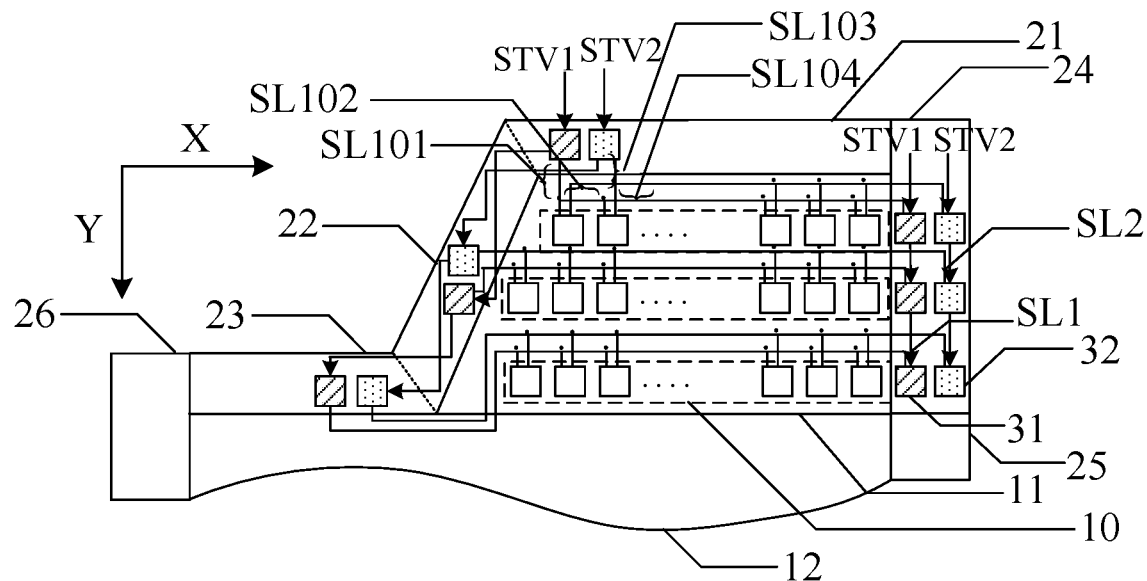
FIG. 3 is a schematic structural diagram of another display panel according to an embodiment of the present disclosure.

Optionally, as shown in FIG. 3, the display panel further includes a fourth non-display region 24, and along the first direction X, the fourth non-display region 24 is located on a side of the first display region 11 facing away from the second non-display region 22.

The display panel further includes first control circuits 31, second control circuits 32, first control lines SL1 and second control lines SL2. The first display region includes a first pixel row 10 extending in the first direction X, the first control line SL1 is electrically connected to pixels in the first pixel row 10, a first end of the first control line SL1 is electrically connected to the first control circuit 31, and a second end of the first control line SL1 is electrically connected to the first control circuit 31. The second control line SL2 is electrically connected to the pixels in the first pixel row 10, a first end of the second control line SL2 is electrically connected to the second control circuit 32, a second end of the second control line SL2 is electrically connected to the second control circuit 32, the first control line SL1 and the second control line SL2 are connected to different transistors in a same pixel, and a signal transmitted by the first control line SL1 is different from a signal transmitted by the second control line SL2. In other words, the first control circuit 31 and the second control circuit 32 transmit different signals. As shown in FIG. 3, the first control circuit 31 transmits a signal STV1 in a cascaded manner, and the second control circuit 32 transmits a signal STV2 in a cascaded manner. The same applies to the following embodiments, and the details are not repeated.

The fourth non-display region 24 includes the first control circuit 31 and second control circuit 32. At least one of the first non-display region 21, the second non-display region 22 or the third non-display region 23 includes the first control circuit 31, and/or at least one of the first non-display region 21, the second non-display region 22 or the third non-display region 23 includes the second control circuit 32.

Specifically, the first control circuit 31 is configured to provide a first control signal for each of the pixels in the first pixel row 10 through the first control line SL1, and the second control circuit 32 is configured to provide a second control signal for each of the pixels in the first pixel row 10 through the second control line SL2. One control line is connected to two control circuits, that is, the two control circuits transmit control signals from two ends of the control line to the control line so as to provide the control signals for a row of pixels. This control manner is double-sided drive control, and the double-sided drive control can improve the transmission effect of the first control line SL1 and reduce the voltage drop (IR-drop) of the first control line SL1 in the first direction X. It should be understood that the double-sided drive control can also improve the transmission effect of the second control line SL2 and reduce the voltage drop (IR-drop) of the second control line SL2 in the first direction X. When both the first control signal and the second control signal need to be provided by the double-sided drive control, a frame region of the irregular region needs to be the same as a frame region of the regular region (i.e., the fourth non-display region 24), that is, the first control circuit 31 and the second control circuit 32 are accommodated at the same time. As shown in FIG. 3, the first end of the first control line SL1 is electrically connected to the first control circuit 31, the second end of the first control line SL1 is electrically connected to the first control circuit 31, the first end of the second control line SL2 is electrically connected to the second control circuit 32, and the second end of the second control line SL2 is electrically connected to the second control circuit 32, where the first control circuit 31 connected to the first end of the first control line SL1 is located in the fourth non-display region 24, and the second control circuit 32 connected to the first end of the second control line SL2 is also located in the fourth non-display region 24. If the first control circuit 31 electrically connected to the second end of the first control line SL1 and the second control circuit 32 electrically connected to the second end of the second control line SL2 are all disposed in the second non-display region 22 opposite to the fourth non-display region 24, which inevitably results in an increase in the width of the second non-display region 22, and the width of the second non-display region 22 is significantly greater than the width of the first non-display region 21 and the width of the third non-display region 23. Therefore, in the above-described embodiments, the first control circuit 31 and the second control circuit 32 which need to be provided are shared by the first non-display region 21 and/or the third non-display region 23 and/or the second non-display region 22 together, so that the difference in widths of the frames of the irregular region in the display panel can be reduced, the uniformity of the frames of the irregular region can be further improved, and thus the visual experience of the user during use can be further improved.

A connection line for identifying the first control circuit 31/and the second control circuit 32 in cascade with each other shown in FIG. 3 is not limited that wires in the display panel are the same as a connection line shown in the drawings in a specific implementation, and is merely exemplary. The same applies to the following embodiments, and the details are not repeated.

Optionally, as shown in FIG. 3 and or 4, the first control circuit 31 and the second control circuit 32 may be alternately arranged in the second direction Y.

Optionally, as shown in FIG. 3, the first control line SL1 includes a first control line segment SL101 and a second control line segment SL102. The first control line segment SL101 is located in the first display region 11, and the second control line segment SL102 is electrically connected to the first control line segment SL101, an extension direction of the first control line segment SL101 intersects an extension direction of the second control line segment SL10, specifically, the extension direction of the first control line segment SL101 is the X direction, the extension direction of the second control line segment SL102 is the Y direction, and the second control line segment SL102 is connected in series between the first control line segment SL101 and the first control circuit 31 located in the first non-display region 21 or the third non-display region 23. Optionally, the second control line SL2 includes a third control line segment SL103 and a fourth control line segment SL104, the third control line segment SL103 is located in the first display region 11, and the fourth control line segment SL104 is electrically connected to the third control line segment SL103, an extension direction of the third control line segment SL103 intersects an extension direction of the fourth control line segment SL104. Specifically, the extension direction of the third control line segment SL103 is the X direction, the extension direction of the fourth control line segment SL104 is the Y direction, and the fourth control line segment SL104 is connected in series between the third control line segment SL103 and the second control circuit 32 located in the first non-display region 21 or the third non-display region 23.

Specifically, as shown in FIG. 3, when the first control circuit 31 or the second control circuit 32 is located in the first non-display region 21 or the third non-display region 23, the wire of the control line may be routed directly from the first display region 11 and/or the second display region 12 to the first non-display region 21 or the third non-display region 23 through the first control line segment SL101 and the second control line segment SL102 intersecting with each other, without passing through the second non-display region 22, it is not necessary to provide a control line wire in the second non-display region 22 so that the second end of the first control line SL1 is connected to the first control circuit 31 located in the first non-display region 21 or the third non-display region 23, and it is also not necessary to provide the control line wire in the second non-display region 22 so that the second end of the second control line SL2 is connected to the second control circuit located in the first non-display region 21 or the third non-display region 23, thereby reducing a number of control line wires in the second non-display region 22, further reducing the space of the second non-display region 22 occupied by the control line wires, and further reducing the width of the second non-display region 22.

In order to more clearly show the positions of the first non-display region 21, the second non-display region 22, the third non-display region 23, and the fourth non-display region 24 relative to the first display region 11, the first display region 11 and the periphery of the first display region 11 are magnified in FIG. 3, and a part of the second display region 12, the fifth non-display region 25 and the sixth non-display region 26 are correspondingly omitted, while a control circuit for providing the control signals for the pixels in the second display region 12 in the fifth non-display region 25 and the sixth non-display region 26 is omitted, and this does not indicate that the entire second display region 12, the entire third non-display region 23, the entire fourth non-display region 24, and the corresponding control circuit do not exist in the embodiment shown in FIG. 3, and the same applies to the drawings of the following embodiments, and the details are not repeated. Moreover, in order to clearly display the positions of the first control circuit 31 and the second control circuit 32 in the first non-display region 21, the second non-display region 22, the third non-display region 23, and/or the fourth non-display region 24, the width of the first non-display region 21, the width of the second non-display region 22 and the width of the third non-display region 23 in FIG. 3 as well as the size ratio of the first display region 11 are enlarged, which does not indicate that the size ratio of the actual product is the same as that in the accompanying drawings, the same applies to the drawings of the following embodiments, and the details are not repeated.

Figure 4:
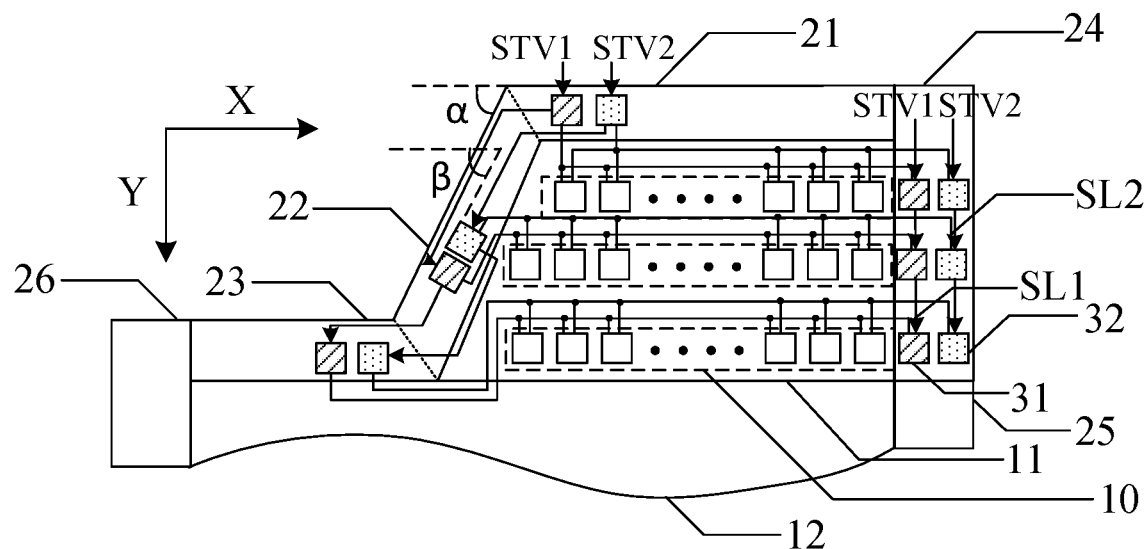
FIG. 4 is a schematic structural diagram of another display panel according to an embodiment of the present disclosure.

Optionally, as shown in FIG. 4, an extension direction of an edge of the first display region 11 facing the second non-display region 22 intersects the first direction, that is, the edge of the first display region 11 facing the second non-display region 22 is an inclined edge. The second non-display region 22 includes a first control circuit 31, and the first control circuit 31 is disposed obliquely relative to the first direction X. Optionally, the first control circuit 31 may include a first output transistor (not shown in the drawings), and an included angle A between a dummy extension line of a channel of the first output transistor and the inclined edge is A, where $45°≤A≤90°$. The second non-display region 22 includes a second control circuit 32, and the second control circuit 32 is disposed obliquely relative to the first direction X. Optionally, the second control circuit 32 may include a second output transistor (not shown in the drawings), and an included angle between a dummy extension line of a channel of the second output transistor and the inclined edge is B, where $45°≤B≤90°$. It should be understood that the channel of the transistor may include a polysilicon or an oxide semiconductor (such as, indium gallium zinc oxide).

Optionally, a first included angle $\alpha$ exists between the cutting edge of the second non-display region 22 and the first direction X, where $45°≤\alpha≤90°$, that is, an edge of the first display region 11 facing the irregular region is inclined, and portions of the first control line SL1 and the second control line SL2, to which the first control circuit 31 and the second control circuit 32 located in the second non-display region 22 are connected, in the second non-display region 22 also have a second angle with the first direction X, and the circuit wire in the first control circuit 31 and the second control circuit 32 located in the second non-display region 22 also has a second included angle $\beta$ with the first direction X, where $45°% \beta≤90°$. Specifically, an angle of the second included angle $\beta$ is the same as an angle of the first included angle $\alpha$, in consideration of the influence of factors such as process error, a certain error exists between the angle of the second included angle $\beta$ and the angle of the first included angle $\alpha$, if a difference value between the angle of the second angle $\beta$ and the angle of the first angle $\alpha$ is within the error range, it can be considered that the angle of the second angle $\beta$ is the same as the angle of the first angle $\alpha$. When the second non-display region 22 is disposed obliquely, the first control circuit 31 and the second control circuit 32 as well as the corresponding control lines are disposed obliquely in cooperation with the second non-display region 22, so that the space of the second non-display region 22 occupied by the first control circuit 31 and the second control circuit 32 can be further reduced, and thus the width of the second non-display region 22 is further reduced.

Optionally, when a number of first pixel rows 10 in the first display region 11 is greater than or equal to a first preset threshold, the first non-display region 21 and the fourth non-display region 24 include the first control circuit 31, and the second non-display region 22, the third non-display region 23 and the fourth non-display region 24 include the second control circuit 32. Alternatively, the second non-display region 22 and the fourth non-display region 24 include the first control circuit 31, and the first non-display region 21, the third non-display region 23 and the fourth non-display region 24 include the second control circuit 32. Alternatively, the third non-display region 23 and the fourth non-display region 24 include the first control circuit 31, and the first non-display region 21, the second non-display region 22 and the fourth non-display region 24 include the second control circuit 32.

When a number of pixel lines in the first display region 11 is relatively large, it is indicated that the first control circuit 31 and the second control circuit 32 connected to the pixel lines are also relatively large. Therefore, it is necessary to share the first control circuit 31 and the second control circuit 32 that need to be provided together with the first non-display region 21, the third non-display region 23 and the second non-display region 22, thereby reducing the difference in widths of the frames of the irregular region in the display panel, further improving the consistency of the frame of the irregular region, and thus further improving the visual experience of the user during use.

Figure 5:
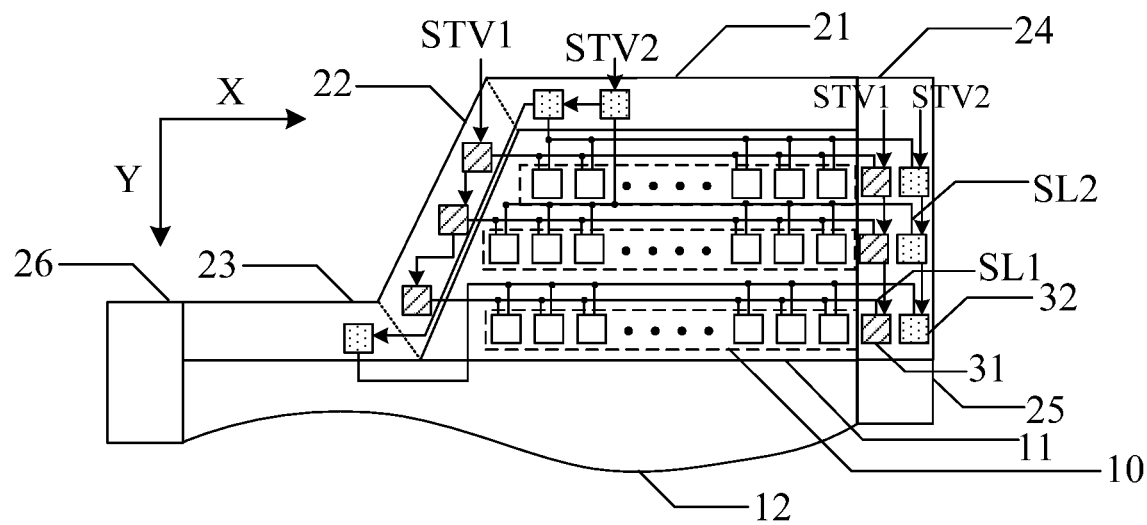
FIG. 5 is a schematic structural diagram of another display panel according to an embodiment of the present disclosure.

Specifically, in order to facilitate the control line wire, as shown in FIG. 5, when the number of first pixel rows 10 in the first display region 11 is greater than or equal to the first preset threshold, optionally, the second non-display region 22 and the fourth non-display region 24 include the first control circuit 31, and the first non-display region 21, the third non-display region 23 and the fourth non-display region 24 include the second control circuit 32. A part of the first control circuits 31 is disposed in the fourth non-display region 24, and another part of the first control circuits 31 is completely disposed in the second non-display region 22. The first control line SL1 may be wired in a conventional manner (namely, a manner of being connected to the first control circuit 31 located in the fourth non-display region 24) when being connected to the first control circuit 31 located in the second non-display region 22. In the above-described embodiments, it is only necessary to change the wire of the second control line SL2 to the second control circuit 32.

Optionally, when the number of first pixel rows 10 in the first display region 11 is less than the first preset threshold, the first non-display region 21 and the fourth non-display region 24 include the first control circuit 31, the fourth non-display region 24 includes the second control circuit 32, and the second non-display region 22 or the third non-display region 23 includes the second control circuit 32. Or, the second non-display region 22 and the fourth non-display region 24 include the first control circuit 31, the fourth non-display region 24 includes the second control circuit 32, and the first non-display region 21 or the third non-display region 23 includes the second control circuit 32; or, the third non-display region 23 and the fourth non-display region 24 include the first control circuit 31, the fourth non-display region 24 includes the second control circuit 32, and the first non-display region 21 or the second non-display region 22 includes the second control circuit 32.

When the number of pixel lines in the first display region 11 is relatively small, it is indicated that the first control circuit 31 and the second control circuit 32 connected to the pixel lines are also relatively small, so that the first control circuit 31 and the second control circuit 32 that need to be disposed can be shared by using the three non-display regions together at different times, thereby simplifying wiring while reducing the difference in widths of the frames of the irregular region in the display panel.

Figure 6:
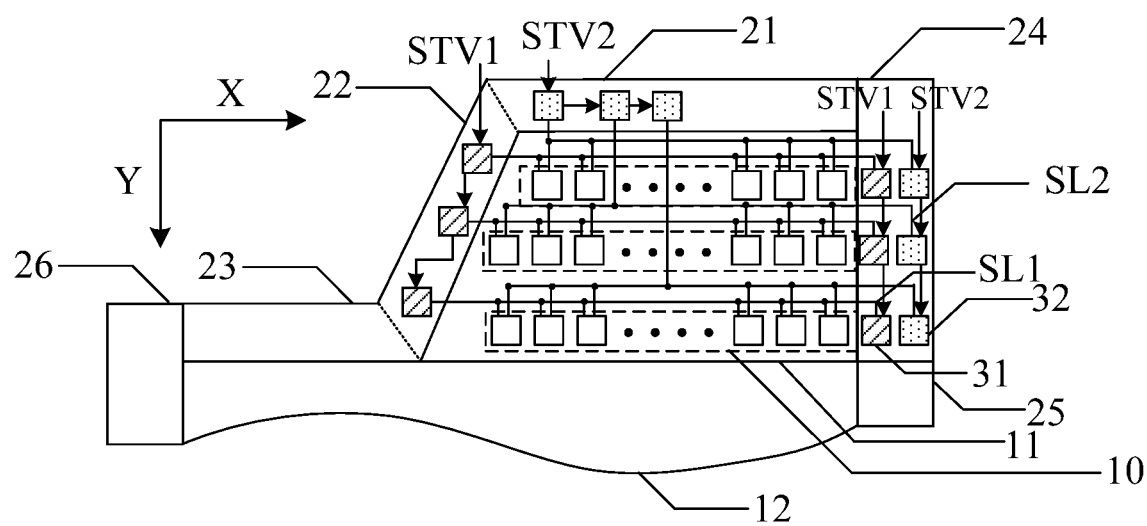
FIG. 6 is a schematic structural diagram of another display panel according to an embodiment of the present disclosure.
Figure 7:
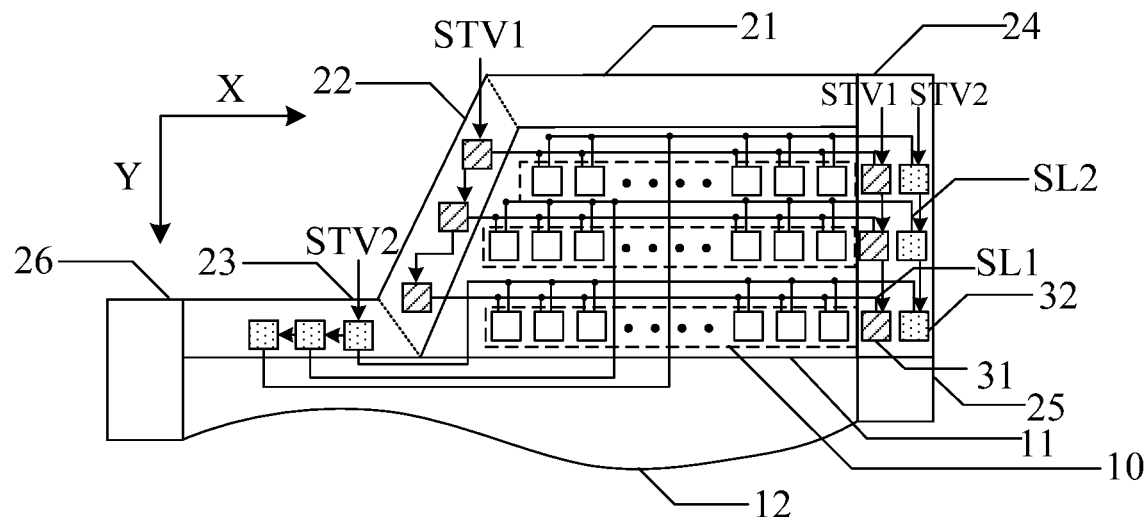
FIG. 7 is a schematic structural diagram of another display panel according to an embodiment of the present disclosure.

Specifically, in order to facilitate the control line wire, as shown in FIG. 6 or FIG. 7, when a number of first pixel rows 10 in the first display region 11 is less than the first preset threshold, optionally, the second non-display region 22 and the fourth non-display region 24 include the first control circuit 31, the fourth non-display region 24 includes the second control circuit 32, and the first non-display region 21 or the third non-display region 23 includes the second control circuit 32. A part of the first control circuits 31 is disposed in the fourth non-display region 24, and another part of the first control lines SL1 is completely disposed in the second non-display region 22. The first control line SL1 may be wired in a conventional manner (namely, a manner of being connected to the first control circuit 31 located in the fourth non-display region 24) when being connected to the first control circuit 31 located in the second non-display region 22. In the above-described embodiments, it is only necessary to change the wire of the second control line SL2 to the second control circuit 32.

The purpose of setting the above-described first preset threshold is only to distinguish the number of pixel lines in the first display region 11, and different embodiments are given according to the number of pixel lines in the first display region 11, where the specific value of the first preset threshold is not limited herein.

Optionally, the second display region 12 includes a second pixel row 20, the first control circuit 31 is a scan control circuit, and the second control circuit 32 is a transmit control circuit.

A ratio of a number of pixels in the first pixel row 10 to a number of pixels in the second pixel row 20 is greater than a second preset threshold, and a number of second control lines SL2 connected to one second control circuit 32 is greater than or equal to a third preset threshold.

Figure 8:
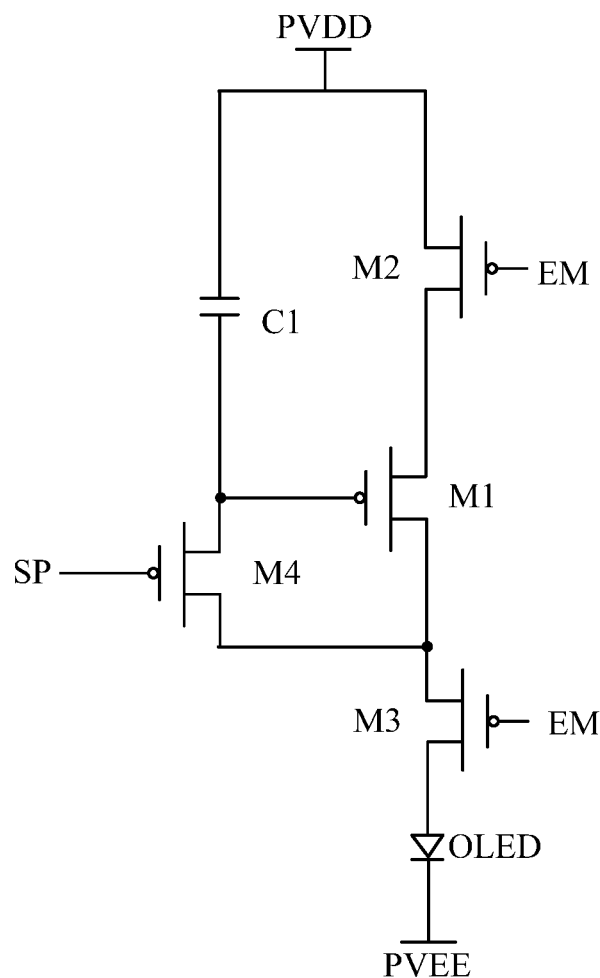
FIG. 8 is a schematic structural diagram of a pixel circuit according to an embodiment of the present disclosure.

As shown in FIG. 8, the pixel includes a pixel circuit and a light-emitting element organic light-emitting diode (OLED). The pixel circuit includes a drive transistor M1, a threshold compensation transistor M4 and light-emitting control transistors M2, M3. The drive transistor M1 provides a drive signal for the light-emitting element, and the light-emitting control transistors M2 and M3 transmit the drive signal to the light-emitting element. A first electrode of the threshold compensation transistor M4 is connected to a second electrode of the drive transistor M1, and a second electrode of the threshold compensation transistor M4 is connected to a gate of the drive transistor M1, and the threshold compensation transistor M4 provides threshold compensation for the drive transistor M1 by providing voltage of the first electrode of the drive transistor M1 to the gate. Specifically, the pixel circuit further includes a storage capacitor Cst. Specifically, the above-described scan control circuit is configured to provide an on or off scan signal SP for the gate of the threshold compensation transistor M4, and the above-described transmit control circuit is configured to provide an on or off transmit signal EM for the gates of the light-emitting control transistors M2 and M3. If the drive capability of the scan signal SP is insufficient, then the drive transistor M1 cannot obtain the sufficient threshold compensation, thereby affecting the subsequent supply of the drive signal to the light-emitting element OLED. Therefore, the scan driving circuit providing the scan signal SP has a relatively high drive capability requirement. Therefore, if the ratio of the number of pixels in the first pixel row 10 to the number of pixels in the second pixel row 20 is relatively large, it is indicated that the number of pixels that need to be driven is relatively high in the first pixel row 10, and the scan signal SP described above needs to be provided by the double-sided drive. The transmit signal EM is configured to enable the power supply signal VDD to be provided to the drive transistor M1 and enable the drive signal to be provided to the light-emitting element OLED, which has low requirement on the drive capability. Therefore, when a group of transmit control circuits needs to drive multiple rows of pixels, the transmit signal EM described above may be provided by the double-sided drive.

Specifically, the transistors shown in FIG. 8 are all P-type transistors, and may be low temperature poly-silicon (LTPS) transistors. In a specific implementation, the transistor in FIG. 8 may be partially or totally replaced with an N-type transistor, and may be an indium gallium zinc oxide (IGZO) transistor.

Optionally, when the N-type transistor is included in the pixel circuit and the N-type transistor is electrically connected to the gate of the drive transistor M1, the first control circuit 31 may be a circuit for controlling the N-type transistor, and the second control circuit 32 may be the transmit control circuit. In this case, the first control line may be set to be the double-sided drive, and the second control line may be set to be a single-sided drive, that is, the first end and the second end of the first control line are both electrically connected to the first control circuit 31, and the first control circuit 31 electrically connected to the first end of the first control line is located in the fourth non-display region, and the first control circuit 31 electrically connected to the second end of the first control line may be located in the first non-display region, the second non-display region, or the third non-display region. The first end of the second control line is electrically connected to the second control circuit 32, and the second control circuit 32 is located in the fourth non-display region.

Figure 9:
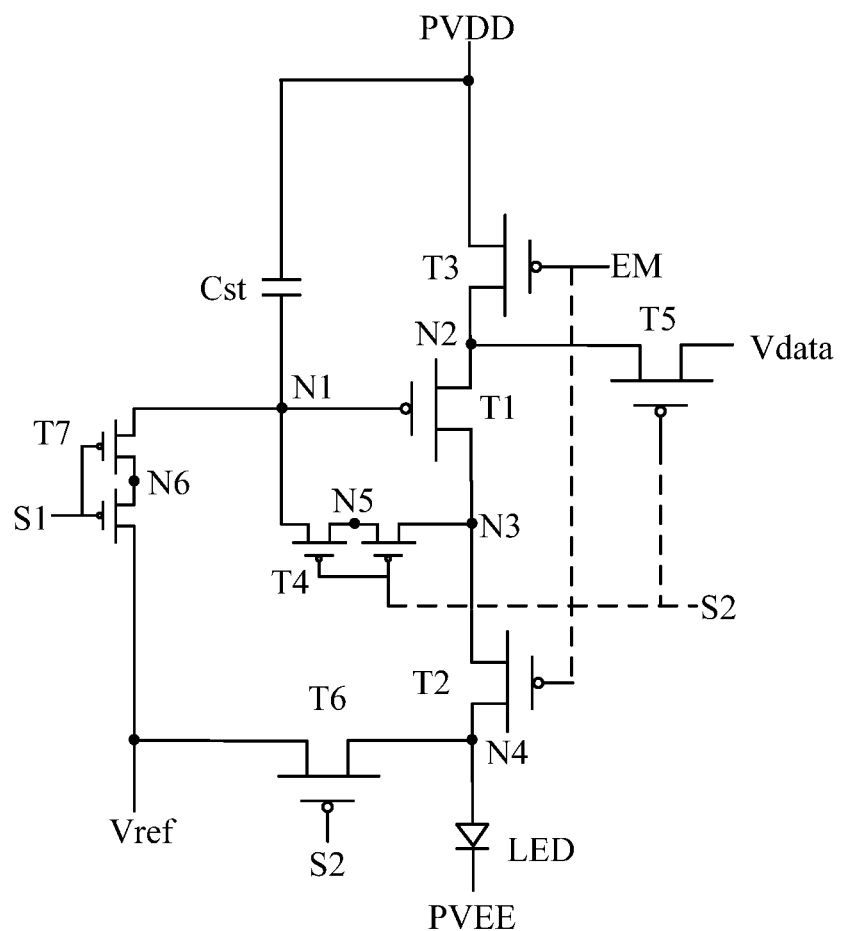
FIG. 9 is a schematic structural diagram of another pixel circuit according to an embodiment of the present disclosure.
Figure 10:
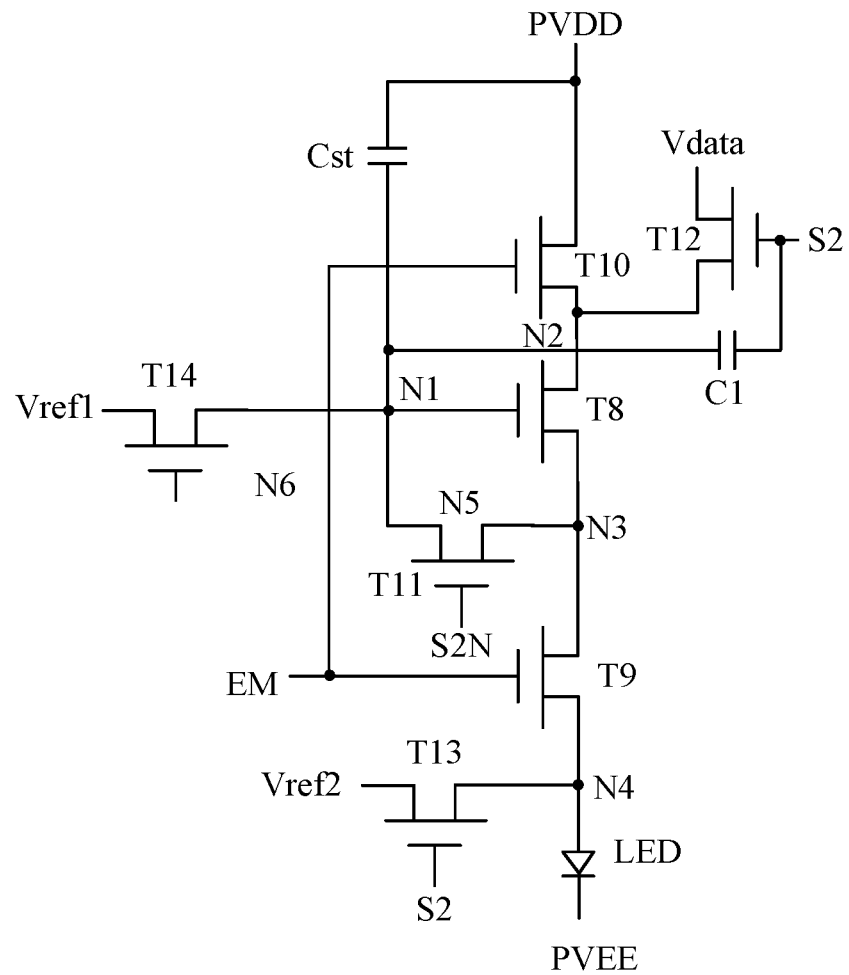
FIG. 10 is a schematic structural diagram of another pixel circuit according to an embodiment of the present disclosure.

In order to further explain the pixel circuit in the above-described embodiments, FIG. 9 and FIG. 10 show the pixel circuit and the light-emitting element in two more specific embodiments, respectively. Specifically, the pixel circuit in the embodiment of FIG. 9 includes a drive transistor T1, a threshold compensation transistor T4, light-emitting control transistors T2, T3, a data write transistor T5, reset transistors T7, T6, and a storage capacitor Cst The functions of the drive transistor T1, the threshold compensation transistor T4, the light-emitting control transistors T2, T3, and the storage capacitor Cst in the circuit may refer to the drive transistor M1, the threshold compensation transistor M4, and the light-emitting control transistors M2, M3 in the embodiment of FIG. 8, the data write transistor T5 is configured to write a data signal Vdata to the drive transistor T1, the reset transistor T7 is configured to reset the gate voltage of the drive transistor T1, and the reset transistor T6 is configured to reset the anode voltage of the light-emitting element LED. Specifically, the transistor in the embodiment shown in FIG. 9 may be a low temperature poly-silicon (LTPS) transistor.

Specifically, the pixel circuit in the embodiment of FIG. 10 includes a drive transistor T8, a threshold compensation transistor T11, a light-emitting control transistor T9, T10, a data write transistor T12, reset transistors T13, T14, a storage capacitor Cst, and a capacitor C1. The functions of the drive transistor T8, the threshold compensation transistor T11, the light-emitting control transistors T9, T10, and the storage capacitor Cst in the circuit may refer to the drive transistor M1, the threshold compensation transistor M4, and the light-emitting control transistors M2, M3 in the embodiment of FIG. 8, and the functions of the data write transistor T12 and the reset transistor T13, T14 in the circuit may refer to the data write transistor T5 and the reset transistors T7, T6 in the embodiment of FIG. 9. Specifically, the transistor in the embodiment shown in FIG. 10 may be an indium gallium zinc oxide (IGZO) transistor.

Optionally, the second preset threshold k ranges from $0.4 \leq k \leq 0.6$, and optionally, k=0.5. The same applies to the second preset threshold in the following embodiments, and the details are not repeated.

Optionally, the third preset threshold l ranges from $3 \leq l \leq 5$, and optionally, l=4. The same applies to the third preset threshold in the following embodiments, and the details are not repeated.

Optionally, the second display region 12 includes a second pixel row 20, the first control circuit 31 is a transmit control circuit, and the second control circuit 32 is a scan control circuit. A ratio of a number of pixels in the first pixel row 10 to a number of pixels in the second pixel row 20 is greater than a second preset threshold, and a number of first control lines SL1 connected to one first control circuit 31 is greater than or equal to the third preset threshold.

Figure 11:
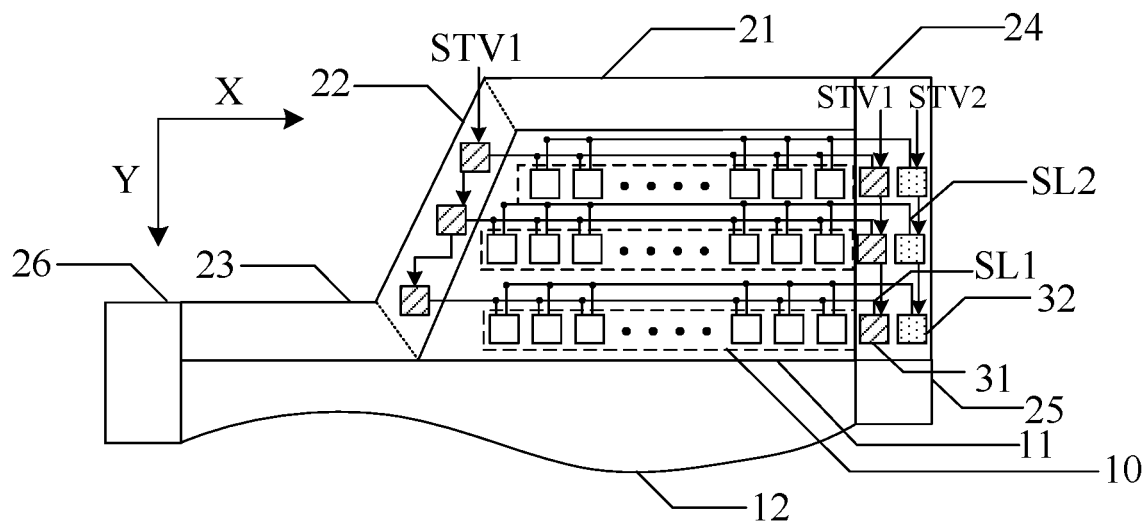
FIG. 11 is a schematic structural diagram of another display panel according to an embodiment of the present disclosure.

Optionally, as shown in FIG. 11, the display panel further includes a fourth non-display region 24, and along the first direction X, the fourth non-display region 24 is located on a side of the first display region 11 facing away from the second non-display region 22.

The display panel further includes first control circuits 31, second control circuits 32, first control lines SL1 and second control lines SL2. The first display region 11 includes a first pixel row 10 extending in the first direction X, the first control line SL1 is electrically connected to pixels in the first pixel row 10, a first end of the first control line SL1 is electrically connected to the first control circuit 31, and a second end of the first control line SL1 is electrically connected to the first control circuit 31. The second control line SL2 is electrically connected to the pixels in the first pixel row 10, one end of the second control line SL2 is electrically connected to the second control circuit 32, and the first control line SL1 and the second control line SL2 are connected to different transistors in a same pixel.

The second non-display region 22 includes the first control circuit 31, and the fourth non-display region 24 includes the first control circuit 31 and the second control circuit 32.

Specifically, the second control line SL2 shown in FIG. 11 is connected to only one second control circuit 32, that is, one control circuit transmits a control signal from one end of the control line to the control line, thereby providing the control signal for a row of pixels. The control manner is single-sided drive control, although the single-sided drive cannot improve the transmission effect of the second control line SL2, when the drive capability of the pixel is not too high, the single-sided drive can satisfy the drive requirement and save the area of the frame region occupied by the control circuit. When the second control circuit 32 is the single-sided drive, in order to reduce the area of the frame of the irregular region occupied by the control circuit, the second control circuit 32 is disposed only in the fourth non-display region 24, and meanwhile, in order to facilitate the control line wire, the first control circuit 31 of the double-sided drive is directly disposed in the second non-display region 22 opposite to the fourth non-display region 24.

Optionally, the second display region 12 includes a second pixel row 20, the first control circuit 31 is a scan control circuit, and the second control circuit 32 is a transmit control circuit.

A ratio of a number of pixels in the first pixel row 10 to a number of pixels in the second pixel row 20 is greater than a second preset threshold, and a number of second control lines SL2 connected to one second control circuit 32 is less than the third preset threshold.

If the ratio of the number of pixels in the first pixel row 10 to the number of pixels in the second pixel row 20 is relatively large, it is indicated that the number of pixels that need to be driven is relatively high in the first pixel row 10, and the scan signal SP described above needs to be provided by the double-sided drive. When a group of transmit control circuits does not need to drive multiple rows of pixels, the transmit signal EM described above may be provided by the single-sided drive in order to reduce the area of the frame and to save the manufacturing cost.

Optionally, the second display region 12 includes a second pixel row 20, the first control circuit 31 is a transmit control circuit, and the second control circuit 32 is a scan control circuit. A ratio of a number of pixels in the first pixel row 10 to a number of pixels in the second pixel row 20 is greater than the second preset threshold, and a number of first control lines SL1 connected to one first control circuit 31 is less than the third preset threshold.

Figure 12:
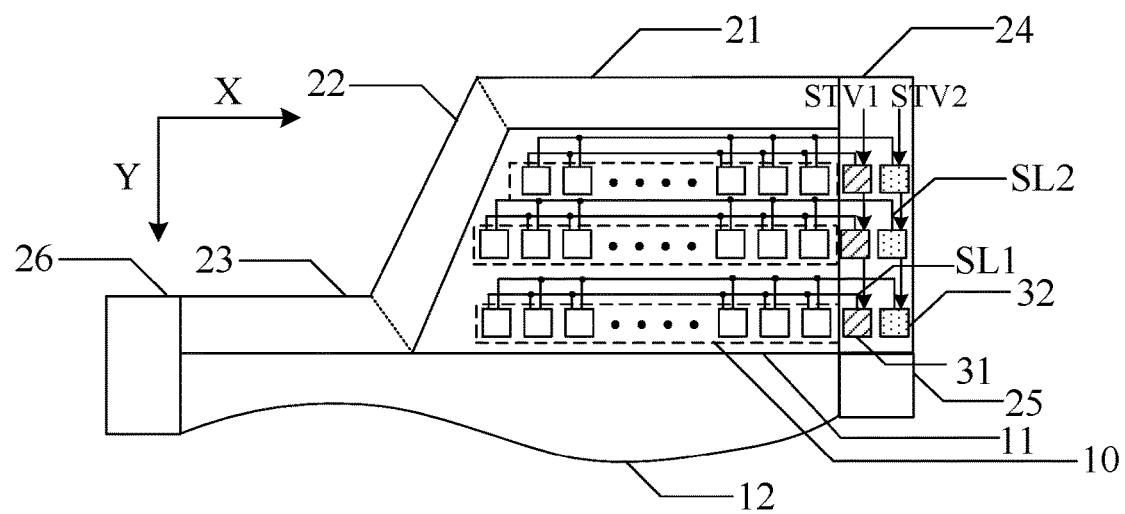
FIG. 12 is a schematic structural diagram of another display panel according to an embodiment of the present disclosure.

Optionally, as shown in FIG. 12, the display panel further includes a fourth non-display region 24, and along the first direction X, the fourth non-display region 24 is located on a side of the first display region 11 facing away from the second non-display region 22.

The display panel further includes first control circuits 31, second control circuits 32, first control lines SL1 and second control lines SL2. The first display region 11 includes a first pixel row 10 extending in the first direction X, the first control line SL1 is electrically connected to pixels in the first pixel row 10, and one end of the first control line SL1 is electrically connected to the first control circuit 31. The second control line SL2 is electrically connected to the pixels in the first pixel row 10, one end of the second control line SL2 is electrically connected to the second control circuit 32, and the first control line SL1 and the second control line SL2 are connected to different transistors in a same pixel.

The fourth non-display region 24 includes the first control circuit 31 and the second control circuit 32.

Specifically, one first control line SL1 shown in FIG. 12 is connected to only one first control circuit 31, and one second control line SL2 is connected to only one second control circuit 32. In order to avoid that the control circuit occupies the area of the frame of the irregular region, the first control circuit 31 and the second control circuit 32 are disposed in only the fourth non-display region 24.

Optionally, the second display region 12 includes a second pixel row 20, the first control circuit 31 is a scan control circuit, and the second control circuit 32 is a transmit control circuit. Alternatively, the first control circuit 31 is a transmit control circuit, and the second control circuit 32 is a scan control circuit.

A ratio of a number of pixels in the first pixel row 10 to a number of pixels in the second pixel row 20 is less than or equal to the second preset threshold, and a number of the second control lines SL2 connected to one second control circuit 32 is less than the third preset threshold.

If the ratio of the number of pixels in the first pixel row 10 to the number of pixels in the second pixel row 20 is relatively small, then it is indicated that the number of pixels that need to be driven is relatively small in the first pixel row 10. The scan signal SP described above may be provided by the single-sided drive in order to reduce the area of the frame and to save the manufacturing cos. When a group of transmit control circuits does not need to drive multiple rows of pixels, the transmit signal EM described above may be provided by the single-sided drive in order to reduce the area of the frame and to save the manufacturing cos.

Figure 13:
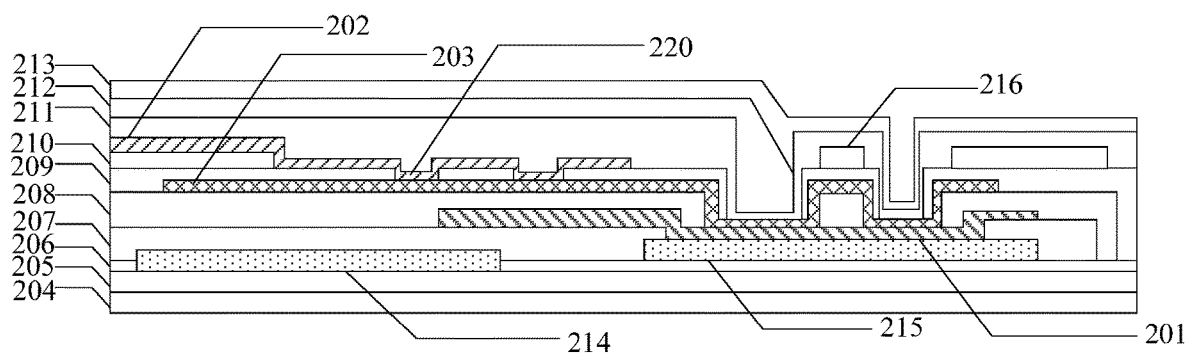
FIG. 13 is a schematic sectional structural diagram of a display panel according to an embodiment of the present disclosure.

Optionally, the display panel described above further includes a cathode signal line located in the non-display region. FIG. 13 shows a partial cross-sectional structure of the display panel, the cathode signal line 201 and a cathode 202 of a pixel of the multiple pixels are disposed at different layers, and the cathode signal line 201 is electrically connected to the cathode 202 of the pixel. Specifically, the cathode signal line 201 is electrically connected to the cathode 202 of the pixel through a metal layer 203, and the metal layer 203 may be a connection line in the same layer as the anode of the pixel.

The first non-display region 21 and the third non-display region 23 include the cathode signal line, and the second non-display region 22 does not include the cathode signal line.

In the related art, a cathode signal line is laid in the non-display region of the display panel, and a cathode voltage PVEE is provided to the cathode in the pixel through the cathode signal line. Generally, a line width of the cathode signal line is relatively large, and correspondingly, the cathode signal line occupies a part of the area of the non-display region. The cathode signal line in the second non-display region 22 is eliminated, the area of the frame between the display screen 1 and the camera 2 shown in FIG. 1 can be reduced, so that an obvious division line between the display screen 1 and the camera 2 is avoided to a certain extent, thereby improving the visual experience of the user during use. Moreover, since the cathode signal line is conventionally laid in the first non-display region 21 and the third non-display region 23, specifically, the cathode signal line is conventionally laid in the fourth non-display region 24, and the cathode voltage PVEE may be transmitted to the cathode of each pixel in the first display region 11 through the first non-display region 21, the third non-display region 23 and the fourth non-display region 24, therefore, the voltage drop of the cathode voltage VSS is not obviously influenced by the elimination of a part of the cathode signal lines.

Specifically, as shown in FIG. 13, the display panel described above further includes an electrical insulating layer 204, a substrate 205, a first insulating layer 206, a second insulating layer 207, a third insulating layer 208, a pixel definition layer 209, a common electrode layer 210, an inorganic insulating layer 211, an organic insulating layer 212, an encapsulation thin film 213, a control signal line 214, a device metal layer 215, and a support pillar structure 216. The cathode 202 of the pixel is electrically connected to the metal layer 203 through a via hole 220 in the pixel definition layer 209, and thus is electrically connected to the cathode signal line 201. The materials of the first insulating layer 206, the second insulating layer 207, and the third insulating layer 208 may be an organic insulating material or an inorganic insulating material. The first insulating layer 206 may be a gate insulating layer GI, an interlayer dielectric insulating layer IMD, and/or an interlayer dielectric layer ILD. The second insulating layer 207 may be a passivation layer PV and a protective adhesive layer BPL. The third insulating layer 208 may be a flat layer PLN. The inorganic insulating layer 211 may be a chemical vapor deposition layer CVD. The inorganic insulating layer 212 may be an organic layer IJP. FIG. 13 shows only the structure related to the inventive concept of the present disclosure, and the display panel described above may further include other film layer structures not shown in FIG. 13, and the details are not repeated.

Optionally, the first non-display region 21, the second non-display region 22, and the third non-display region 23 each include a cathode signal line, and as shown in FIG. 11, the cathode signal line 201 and the cathode 202 of the pixel are disposed at different layers, and the cathode signal line 201 is electrically connected to the cathode 202 of the pixel. Specifically, the cathode signal line 201 is electrically connected to the cathode 202 of the pixel through the metal layer 203.

A width of the cathode signal line in the first non-display region 21 is H1, a width of the cathode signal line in the second non-display region 22 is H2, and a width of the cathode signal line in the third non-display region 23 is H3, where H2<H1, and H2<H3.

In the related art, a cathode signal line is laid in the non-display region of the display panel, and a cathode voltage VSS is provided to the cathode in the pixel through the cathode signal line, and correspondingly, the cathode signal line occupies a part of the area of the non-display region. The width of the cathode signal line in the second non-display region 22 is reduced, the area of the frame between the display screen 1 and the camera 2 shown in FIG. 1 can be reduced, so that an obvious division line between the display screen 1 and the camera 2 is avoided to a certain extent, thereby improving the visual experience of the user during use.

Figure 14:
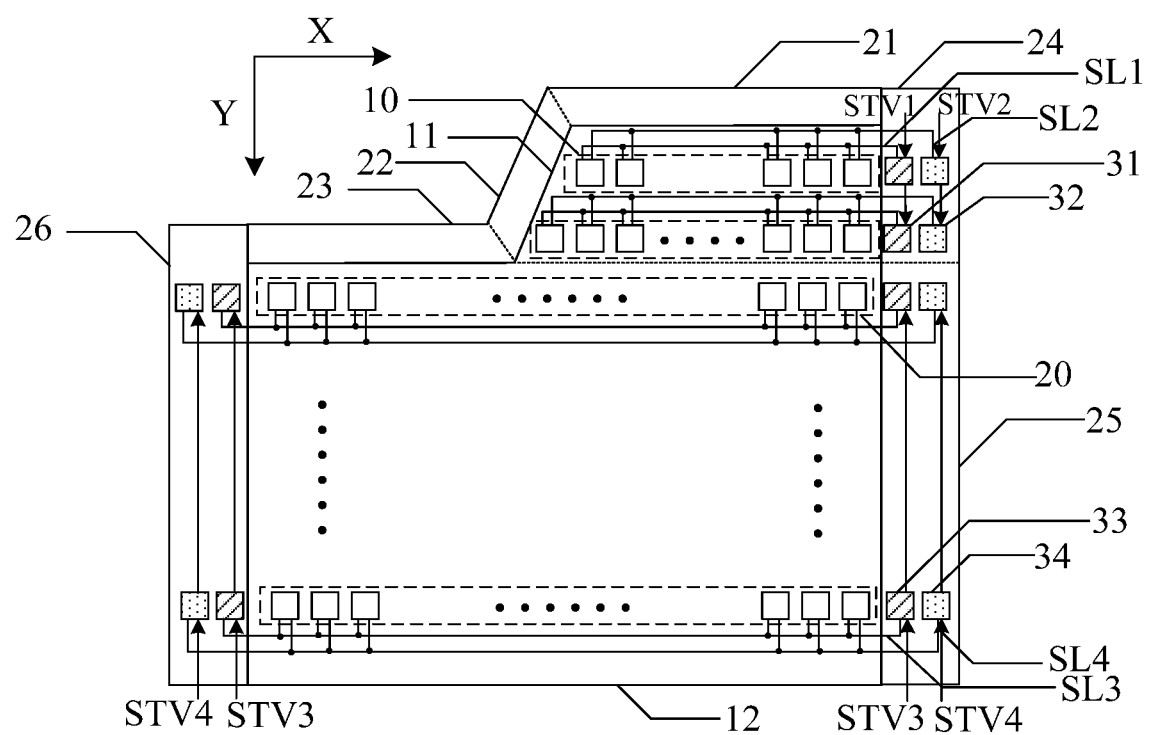
FIG. 14 is a schematic structural diagram of another display panel according to an embodiment of the present disclosure.

Optionally, as shown in FIG. 14, the display panel further includes first control circuits 31, second control circuits 32, third control circuits 33, fourth control circuits 34, first control lines SL1, second control lines SL2, third control lines SL3, and fourth control lines SLA. As shown in FIG. 14, the first control circuit 31 transmits a signal STV1 in a cascaded manner, the second control circuit 32 transmits a signal STV2 in a cascaded manner, the third control circuit 33 transmits a signal STV3 in a cascaded manner, and the fourth control circuit 34 transmits a signal STV4 in a cascaded manner.

The first display region 11 includes a first pixel row 10 extending in the first direction X, the first control line SL1 is electrically connected to pixels in the first pixel row 10, the first control line SL1 is electrically connected to at least one first control circuit 31, and the second control line SL2 is electrically connected to the pixels in the first pixel row 10 and to at least one second control circuit 32. The second display region 12 includes a second pixel row 20 extending in the first direction X, the third control line SL3 is electrically connected to pixels in the second pixel row 20, and the third control line SL3 is electrically connected to the at least one third control circuit 33. The fourth control line SLA is electrically connected to the pixels in the second pixel row 20 and to the at least one fourth control circuit 34.

As shown in FIG. 8, the pixel includes a pixel circuit and a light-emitting element OLED. The pixel circuit includes a drive transistor M1, a threshold compensation transistor M4, and light-emitting control transistors M2, M3. The drive transistor M1 provides a drive signal to the light-emitting element, and the light-emitting control transistors M2 and M3 transmit the drive signal to the light-emitting element. The first electrode of the threshold compensation transistor M4 is connected to the second electrode of the drive transistor M1, the second electrode of the threshold compensation transistor M4 is connected to the gate of the drive transistor M1, and the threshold compensation transistor M4 provides the threshold compensation for the drive transistor M1 by providing the voltage of the first electrode of the drive transistor M1 to the gate.

The first control line SL1 is connected to the gate of the threshold compensation transistor M4 of the pixels in the first pixel row 10, and the second control line SL2 is connected to the gates of the light-emitting control transistors M2 and M3 in the first pixel row 10. The third control line SL3 is connected to the gate of the threshold compensation transistor M4 of the pixels in the second pixel row 20, and the fourth control line SLA is connected to the gates of the light-emitting control transistors M2 and M3 in the second pixel row 20.

A gap exists between an orthographic projection of the first control circuit 31 on the substrate and an orthographic projection of the third control circuit 33 on the substrate. A gap exists between an orthographic projection of the second control circuit 32 on the substrate and an orthographic projection of the fourth control circuit 34 on the substrate.

The pixel in the display panel includes, in operation, a scan stage and a light-emitting stage. The scan stage includes a process for providing the threshold compensation to the drive transistor M1 by the threshold compensation transistor M4 in the above-described embodiments, and the light-emitting stage includes a process for providing a drive signal to the light-emitting element by using the drive transistor M1, and transmitting the drive signal to the light-emitting element by using the light-emitting control transistors M2, M3. The pixels complete the display of one frame of picture through one scan stage and one light-emitting stage. In the above-described embodiments, the first control circuit 31, the second control circuit 32, the third control circuit 33, and the fourth control circuit 34 are respectively used for the first display region 11 and the second display region 12 so as to control the pixel operation, and a gap exists between orthographic projections of the first control circuit 31/the second control circuit 32 on the substrate and orthographic projections of the fourth control circuit 33/the third control circuit 34 on the substrate. It is indicated that the first control circuit 31/the second control circuit 32 and the third control circuit 33/the fourth control circuit 34 are not in a cascaded relationship, no signal line is directly connected to the first control circuit 31 and the third control circuit 33, and no signal line is directly connected to the second control circuit 32 and the fourth control circuit 34, that is, the pixel in the first display region 11 and the pixel in the second display region 12 may be driven and controlled separately, and different pictures are displayed, thereby improving the use flexibility of the display panel.

Optionally, when the first control circuit 31 and the second control circuit 32 are configured to control the first display region 11 to display a preset screen, the third control circuit 33 and the fourth control circuit 34 are configured to control the second display region 12 to turn off the screen.

In a specific implementation, the first display region 11 and the second display region 12 are controlled in a partitioned manner, when the second display region 12 is turned off, UI icons such as time, electric quantity, and network state may be displayed in the first display region 11, so that the display screen is fully utilized to display the information, and meanwhile, the pixels of regions which do not need to be displayed are controlled not to receive control signals transmitted by corresponding control lines, that is, the screens of the regions which do not need to be displayed may be closed, and thus the energy-saving effect is achieved.

Specifically, the display panel described above further includes a main control circuit not shown in the drawings. The main control circuit is configured to control the electrical connection through the first control circuit 31, the second control circuit 32, the third control circuit 33, and/or the fourth control circuit 34 in the above-described embodiments and through the signal lines, and provides the control signal Vcontrol to the first control circuit 31, the second control circuit 32, the third control circuit 33, and/or the fourth control circuit 34, and the first control circuit 31, the second control circuit 32, the third control circuit 33 and/or the fourth control circuit 34 provides the control signal to the first pixel row 10 and the second pixel row 20 in response to the control signal Vcontrol.

Specifically, the above-described display panel further includes a dummy pixel. The dummy pixel is generally disposed around a conventional pixel, an internal circuit structure of the dummy pixel is the same as an internal circuit structure of the conventional pixel, and the dummy pixel only functions to match the conventional pixel. For example, the dummy pixel may be used to generate a reference voltage required by the conventional pixel, so that a reference voltage generation circuit occupying the area of the display panel does not need to be separately provided.

Based on the same inventive concept, corresponding to the display panel in any of the embodiments described above, an embodiment of the present application further provides a display device, and the display device includes the display panel in any of the embodiments described above.

The above-described display device may be disposed in the electronic apparatus such as a folding electronic apparatus shown in FIG. 1, or the above-described display device may be disposed in other electronic apparatus to which the special-shaped display panel may be applied.

The display device in the above-described embodiments includes the corresponding display panel in any one of the foregoing embodiments, and has the beneficial effects of the corresponding embodiments, and the details are not repeated.

It should be noted that, in this text, relational terms such as "first" and "second" are merely used to distinguish one entity or operation from another entity or operation, and do not necessarily require or imply any actual relationship or sequence existing between these entities or operations. Moreover, the terms "include", "contain", or any other variant thereof are intended to cover a non-exclusive inclusion, so that a process, a method, an article, or an apparatus that includes a series of elements not only includes those elements, but also includes other elements that are not explicitly listed, or further includes elements inherent to the process, the method, the article, or the apparatus. If no more limitations are imposed, an element defined by the phrase "including an . . . " does not exclude that another same element exists in the process, the method, the article, or the apparatus that includes the above-described elements.

The foregoing descriptions are merely specific embodiments of the present disclosure, so that those skilled in the art can understand or implement the present disclosure. Various modifications to these embodiments will be readily apparent to those skilled in the art, and the general principles defined herein may be implemented in other embodiments without departing from the spirit or scope of the present disclosure. Therefore, the present disclosure will not be limited to the embodiments described above herein, but should be accorded the widest scope consistent with the principles and novel features disclosed herein.

What is claimed is:

1. A display panel, comprising a first display region, a second display region, a first non-display region, a second non-display region, a third non-display region, and a plurality of pixels, wherein,
    a length of the first display region in a first direction is less than a length of the second display region in the first direction, and the first display region is adjacent to the second display region;
    along a second direction, the first non-display region is located on a side of the first display region facing away from the second display region; along the first direction, the second non-display region is located on a side of the first display region and is located between the first non-display region and the third non-display region, the second non-display region is adjacent to the first non-display region, and the second non-display region is adjacent to the third non-display region; and along the second direction, the third non-display region is located on a side of the second display region facing the first display region, and the first direction intersects the second direction; and
    a width of the first non-display region is a, a width of the second non-display region is b, a width of the third non-display region is c, and a preset difference value is m, wherein $|a-b|\leq m$, $|c-b|\leq m$, and $|a-c|\leq m$.

2. The display panel of claim 1, wherein the width of the first non-display region, the width of the second non-display region, and the width of the third non-display region are all less than a preset width W.

3. The display panel of claim 1, wherein the preset difference value m ranges from $0.08\ \text{mm} \leq m \leq 0.12\ \text{mm}$.

4. The display panel of claim 2, wherein the preset width W ranges from $1.4\ \text{mm} \leq W \leq 1.6\ \text{mm}$.

5. The display panel of claim 1, further comprising a fourth non-display region, wherein along the first direction, the fourth non-display region is located on a side of the first display region facing away from the second non-display region; and
    the display panel further comprises first control circuits, second control circuits, first control lines and second control lines, the first display region comprises a first pixel row extending in the first direction, a first control line of the first control lines is electrically connected to pixels in the first pixel row, a first end of a first control line of the first control lines is electrically connected to a first control circuit of the first control circuits, and a second end of the first control line of the first control lines is electrically connected to a first control circuit of the first control circuits; a second control line of the second control lines is electrically connected to the pixels in the first pixel row, a first end of a second control line of the second control lines is electrically connected to a second control circuit of the second control circuits, a second end of the second control line of the second control lines is electrically connected to a second control circuit of the second control circuits, and a first control line of the first control lines and a second control line of the second control lines are connected to different transistors in a same pixel among the plurality of pixels, wherein,
    the fourth non-display region comprises at least one first control circuit of the first control circuits and at least one second control circuit of the second control circuits; and
    at least one of the first non-display region, the second non-display region or the third non-display region comprises at least one first control circuit of the first control circuits, and/or at least one of the first non-display region, the second non-display region or the third non-display region comprises at least one second control circuit of the second control circuits.

6. The display panel of claim 5, wherein a number of first pixel rows in the first display region is greater than or equal to a first preset threshold;
    the first non-display region and the fourth non-display region comprise the first control circuits, and the second non-display region, the third non-display region and the fourth non-display region comprise the second control circuits;
    the second non-display region and the fourth non-display region comprise the first control circuits, and the first non-display region, the third non-display region and the fourth non-display region comprise the second control circuits; or the third non-display region and the fourth non-display region comprise the first control circuits, and the first non-display region, the second non-display region and the fourth non-display region comprise the second control circuits.

7. The display panel of claim 5, wherein a number of first pixel rows in the first display region is less than a first preset threshold;
wherein
the first non-display region and the fourth non-display region comprise the first control circuits, the fourth non-display region comprises at least one second control circuit of the second control circuits, and the second non-display region or the third non-display region comprises at least one second control circuit of the second control circuits;
or
the second non-display region and the fourth non-display region comprise the first control circuits, the fourth non-display region comprises at least one second control circuit of the second control circuits, and the first non-display region or the third non-display region comprises at least one second control circuit of the second control circuits;
or
the third non-display region and the fourth non-display region comprise the first control circuits, the fourth non-display region comprises at least one second control circuit of the second control circuits, and the first non-display region or the second non-display region comprises at least one second control circuit of the second control circuits.

8. The display panel of claim 5, wherein the first non-display region or the third non-display region comprises at least one first control circuit of the first control circuits;
each of the first control lines comprises a first control line segment and a second control line segment, the first control line segment is located in the first display region, and the second control line segment is electrically connected to the first control line segment, an extension direction of the first control line segment intersects an extension direction of the second control line segment, and the second control line segment is connected in series between the first control line segment and the first control circuits located in the first non-display region or the third non-display region; or
wherein the first non-display region or the third non-display region comprises at least one second control circuit of the second control circuits;
each of the second control lines comprises a third control line segment and a fourth control line segment, the third control line segment is located in the first display region, the fourth control line segment is electrically connected to the third control line segment, an extension direction of the third control line segment intersects an extension direction of the fourth control line segment, and the fourth control line segment is connected in series between the third control line segment and the second control circuits located in the first non-display region or the third non-display region.

9. The display panel of claim 5, wherein the second display region comprises a second pixel row, the first control circuits are scan control circuits, and the second control circuits are transmit control circuits; and a ratio of a number of pixels in the first pixel row to a number of pixels in the second pixel row is greater than a second preset threshold, and a number of second control lines connected to one second control circuit of the second control circuits is greater than or equal to a third preset threshold.

10. The display panel of claim 9, wherein the second preset threshold k ranges from 0.4≤k≤0.6.

11. The display panel of claim 9, wherein the third preset threshold l ranges from 3≤l≤5.

12. The panel of claim 1, further comprising a fourth non-display region, wherein along the first direction, the fourth non-display region is located on a side of the first display region facing away from the second non-display region; and
the display panel further comprises first control circuits, second control circuits, first control lines and second control lines, the first display region comprises a first pixel row extending in the first direction, a first control line of the first control lines is electrically connected to pixels in the first pixel row, a first end of a first control line of the first control lines is electrically connected to a first control circuit of the first control circuits, and a second end of a first control line of the first control lines is electrically connected to a first control circuit of the first control circuits; a second control line of the second control lines is electrically connected to the pixels in the first pixel row, one end of a second control line of the second control lines is electrically connected to a second control circuit of the second control circuits, and a first control line of the first control lines and a second control line of the second control lines are connected to different transistors in a same pixel among the plurality of pixels, wherein,
the second non-display region comprises at least one first control circuit of the first control circuits, and the fourth non-display region comprises at least one first control circuit of the first control circuits and at least one second control circuit of the second control circuits.

13. The display panel of claim 12, wherein the second display region comprises a second pixel row, the first control circuits are scan control circuits, and the second control circuits are transmit control circuits;
a ratio of a number of pixels in the first pixel row to a number of pixels in the second pixel row is greater than a second preset threshold, and a number of second control lines connected to one second control circuit of the second control circuits is less than a third preset threshold.

14. The display panel of claim 1, further comprising a fourth non-display region, wherein along the first direction, the fourth non-display region is located on a side of the first display region facing away from the second non-display region; and
the display panel further comprises first control circuits, second control circuits, first control lines and second control lines, the first display region comprises a first pixel row extending in the first direction, a first control line of the first control lines is electrically connected to pixels in the first pixel row, and one end of a first control line of the first control lines is electrically connected to a first control circuit of the first control circuits;
a second control line of the second control lines is electrically connected to the pixels in the first pixel row, one end of a second control line of the second control lines is electrically connected to a second control circuit of the second control circuits, and a first control line of the first control lines and a second control line of the second control lines are connected to different transistors in a same pixel among the plurality of pixels, wherein the fourth non-display region comprises at least one first control circuit of the first control circuits and at least one second control circuit of the second control circuits.

15. The display panel of claim 14, wherein the second display region comprises a second pixel row;
the first control circuits are scan control circuits, and the second control circuits are transmit control circuits; or the first control circuits are transmission control circuits, and the second control circuits are scan control circuits; and
a ratio of a number of pixels in the first pixel row to a number of pixels in the second pixel row is less than or equal to a second preset threshold, and a number of second control lines connected to one second control circuit of the second control circuits is less than a third preset threshold.

16. The display panel of claim 1, further comprising cathode signal lines, wherein a cathode of the cathode signal lines and a cathode of a pixel of the plurality of pixels are disposed at different layers, and the cathode signal line is electrically connected to the cathode of the pixel; and
the first non-display region and the third non-display region comprise the cathode signal line, and the second non-display region does not comprise the cathode signal line.

17. The display panel of claim 1, wherein the first non-display region, the second non-display region and the third non-display region each comprises a cathode signal line, the cathode signal line and a cathode of a pixel of the plurality of pixels are disposed at different layers, and the cathode signal line is electrically connected to the cathode of the pixel; and
a width of the cathode signal line in the first non-display region is H1, a width of the cathode signal line in the second non-display region is H2, and a width of the cathode signal line in the third non-display region is H3, wherein H2<H1, and H2<H3.

18. The display panel of claim 1, further comprising first control circuits, second control circuits, third control circuits, fourth control circuits, first control lines, second control lines, third control lines and fourth control lines, wherein,
the first display region comprises a first pixel row extending in the first direction, a first control line of the first control lines is electrically connected to pixels in the first pixel row, and a first control line of the first control lines is electrically connected to at least one first control circuit of the first control circuits, a second control line of the second control lines is electrically connected to the pixels in the first pixel row, and a second control line of the second control lines is electrically connected to at least one second control circuit of the second control circuits;
the second display region comprises a second pixel row extending in the first direction, a third control line of the third control lines is electrically connected to pixels in the second pixel row and to at least one third control circuit of the third control circuits, and a fourth control line of the fourth control lines is electrically connected to the pixels in the second pixel row and to at least one fourth control circuit of the fourth control circuits;
a pixel of the plurality of pixels comprises a pixel circuit and a light-emitting element, wherein the pixel circuit comprises a drive transistor, a threshold compensation transistor and a light-emitting control transistor; the drive transistor provides a drive signal for the light-emitting element, and the light-emitting control transistor transmits the drive signal to the light-emitting element; a first electrode of the threshold compensation transistor is connected to a second electrode of the drive transistor, and a second electrode of the threshold compensation transistor is connected to a gate of the drive transistor;
a first control line of the first control lines is connected to a gate of the threshold compensation transistor of the pixels in the first pixel row, and a second control line of the second control lines is connected to a gate of the light-emitting control transistor in the first pixel row;
a third control line of the third control lines is connected to a gate of the threshold compensation transistor of the pixels in the second pixel row, and a fourth control line of the fourth control lines is connected to a gate of the light-emitting control transistor in the second pixel row;
a gap exists between an orthographic projection of a first control circuit of the first control circuits on the substrate and an orthographic projection of a third control circuit of the third control circuits on the substrate; and
a gap exists between an orthographic projection of a second control circuit of the second control circuits on the substrate and an orthographic projection of a fourth control circuit of the fourth control circuits on the substrate.

19. The display panel of claim 18, wherein when the first control circuits and the second control circuits are configured to control the first display region to display a preset screen, the third control circuits and the fourth control circuits are configured to control the second display region to turn off a screen.

20. A display device comprising a display panel, wherein the display panel comprises a first display region, a second display region, a first non-display region, a second non-display region, a third non-display region, and a plurality of pixels;
wherein a length of the first display region in a first direction is less than a length of the second display region in the first direction, and the first display region is adjacent to the second display region;
along a second direction, the first non-display region is located on a side of the first display region facing away from the second display region; along the first direction, the second non-display region is located on a side of the first display region and is located between the first non-display region and the third non-display region, the second non-display region is adjacent to the first non-display region, and the second non-display region is adjacent to the third non-display region; and along the second direction, the third non-display region is located on a side of the second display region facing the first display region, and the first direction intersects the second direction; and
a width of the first non-display region is a, a width of the second non-display region is b, a width of the third non-display region is c, and a preset difference value is m, wherein $|a-b|\leq m$, $|c-b|\leq m$, and $|a-c|\leq m$.

* * * * *